United States Patent [19]

Barton et al.

[11] Patent Number: 4,832,755
[45] Date of Patent: May 23, 1989

[54] GLASS ENCAPSULATION OF SOLAR CELL ARRAYS TO MINIMIZE VOLTAGE/PLASMA INTERACTION EFFECTS IN A SPACE ENVIRONMENT

[75] Inventors: John R. Barton, Kent; Amy C. Reiss; Sidney W. Silverman, both of Seattle, all of Wash.

[73] Assignee: The Boeing Company, Seattle, Wash.

[21] Appl. No.: 84,048

[22] Filed: Aug. 11, 1987

[51] Int. Cl.$^4$ .................................. H01L 25/04
[52] U.S. Cl. ................................. 136/251; 136/292
[58] Field of Search ............... 136/251, 259, 245, 292

[56] References Cited

U.S. PATENT DOCUMENTS

| | | | |
|---|---|---|---|
| 2,606,215 | 8/1952 | Lamb | 136/259 |
| 3,116,171 | 12/1963 | Nielsen et al. | 136/245 |
| 4,097,308 | 6/1978 | Klein et al. | 136/251 |
| 4,132,570 | 1/1979 | Caruso et al. | 136/244 |
| 4,234,351 | 11/1980 | Deminet et al. | 136/251 |
| 4,540,843 | 9/1985 | Gochermann et al. | 136/251 |
| 4,582,953 | 4/1986 | Nagase et al. | 136/259 |

OTHER PUBLICATIONS

Reiss, et al, "Glass Encapsulation Protection for Advanced High Voltage Solar Arrays", Intersociety Energy Conversion Engineering Conference Record, Aug. 25, 1986.
Atzei et al, "Evaluation and Reduction of the Electromagnetic Fields Associated with a Solar Array", Proc. of 9th IEEE Photovoltaic Specialists Conference, pp. 206–216, 1972.
Barton, et al, "High Voltage Solar Array Plasma Production Techniques", Proc. of 18th IEEE Photovoltaic Specialists Conference, Oct. 1985, pp. 411–417.
Bouquet, "Glass as Encapsulation for Low-Cost Photovoltaic Solar Arrays", ASME Transactions, Journal of Solar Energy Engineering, vol. 103, pp. 221–232, Aug. 1981.
Kennerud, "High Voltage Solar Array Operation in the Ionosphere", Proc. of 8th IEEE Photovoltaic Specialists Conference, pp. 282–286, Aug. 1970.
Landis, "Integral Glass Encapsulation for Solar Arrays", Final Report to Jet Propulsion Laboratory under Contract No. DOE/JPL-954521-81/15, Jul. 1981.
Minnucci, et al, "Integral Glass Sheet Encapsulation for Terrestrial Panel Applications", Proc. of the 12th IEEE Photovoltaic Specialists Conference, pp. 309–312, Nov. 1976.
NASA Space Vehicle Design Criteria Monograph SP-8037 (Environment), "Assessment and Control of Spacecraft Magnetic Fields", Sep. 1970.
Purvis, et al, "Environmental Interactions Considerations for Space Station and Solar Array Design", unpublished manuscript.
Shaughnessy, "Design and Fabrication of Solar Cell Modules", Final Technical Report to Jet Propulsion Laboratory under NASA Contract No. DOE/JPL-954655-1, Apr. 1978.
Woodcock, "SPS Silicon Reference System", Final Proceedings of the Solar Power Satellite Program Review, pp. 250–253 (see N82-2267613-44), NASA TM84183, Jul. 1980.

Primary Examiner—Aaron Weisstuch
Attorney, Agent, or Firm—Foley & Lardner, Schwartz, Jeffery, Schwaab, Mack, Blumenthal & Evans

[57] ABSTRACT

The solar cells of a photovoltaic solar cell array are protected from the effects of voltage/plasma interaction in a space environment. The solar array includes a glass enclosure having a substrate and superstrate with integral cell support ridges. The solar cells are held in place, without bonding, by the integral cell support ridges. The solar array is capable of withstanding severe temperature cycling, as the solar cells can freely expand and contract independent of the substrate or superstrate. In addition, a conductive grid is provided on the outer surface of the solar array to provide a zero-potential ground plane to reduce the electric field. The conductive grid provides additional protection against voltage/plasma interaction should the glass enclosure develop holes or cracks, for example, by the penetration of a micrometeor.

22 Claims, 3 Drawing Sheets

GLASS ENCAPSULATION OF SOLAR CELL ARRAYS TO MINIMIZE VOLTAGE/PLASMA INTERACTION EFFECTS IN A SPACE ENVIRONMENT

BACKGROUND OF THE INVENTION

The invention relates to photovoltaic solar cell arrays, and in particular, to photovoltaic solar cell arrays having means for minimizing voltage/plasma interaction effects in a space environment.

Spacecraft power levels have continuously increased since the inception of the Space Age, and this trend is projected to continue into the future. Solar arrays producing hundreds of kilowatts are expected to be required by the mid 1990's, and higher power levels will require voltage levels of hundreds to thousands of volts. However, unprotected solar arrays cannot operate at these very high voltages in the space/plasma environment because of the interaction between the solar array and the space plasma. This interaction can cause corona leakage leading to arc discharges, material damage, and the disruption of spacecraft electrical power.

The natural plasma environment is comprised of charged particles in the magnetosphere and the ionosphere. The shape of the magnetosphere is a function of the sun's magnetic field and the earth's magnetic field as shown in FIG. 1. Van Allen radiation belts are an integral part of the magnetosphere and include an electron belt and a proton belt. These radiation belts overlap-the peak density of the electron belt being at an altitude near 26,000 km and the proton belt near 4,800 km. The magnetosphere is supplied with ions from the solar wind which varies as a function of sun spots and solar flares. Variations in plasma density from the solar activity are primarily evident only above the high-density zone of the inner Van Allen electron belt.

Charged particles of the ionosphere are significantly different than those associated with the magnetosphere. Ionospheric ions have very low velocities (low energy) compared to the high energy protons and electrons of the magnetosphere. Consequently, their effect on solar array components is significantly different. High energy plasma particles degrade solar array performance by penetrating through cover and cell material to cause lattice defects deep within the crystalline structure of solar cells. High energy particles travel too fast to be affected by the electric fields associated with the spacecraft. In contrast, low energy plasma particles cannot cause crystalline lattice degradation, but can be affected by local electric fields associated with nearby hardware.

In addition, spacecraft are typically surrounded by a cloud of outgassing products and effluents. Such a cloud becomes a plasma from ionization action caused by galactic cosmic rays and solar photons, just as in the ionosphere. The induced environment also includes radiated electric fields from on-board equipment, and these fields could be strong at the voltage levels required for high-power solar arrays.

A solar array operating in a plasma environment is surrounded by an enhanced electric field region or magnetic sheath. The electric field acts as an arcing path between the solar array and the plasma. The electric field thickness may be obtained from the Child-Langmuir theory:

$$d = 9330 \{(T)^{-0.25} (n_e) V^{0.75}\} \quad (1)$$

where d is the electric field thickness in meters, $n_e$ is the plasma density in ions/cubic meter, V is the surface potential in volts, and T is the plasma temperature in eV. Corona leakage may lead to arcing on portions of the solar array that operate at negative potentials with respect to plasma ground.

Corona leakage phenomena take place when the potential difference exceeds the breakdown initiation voltage as shown in FIG. 2. Since breakdown initiation voltage varies with solar activity, separate curves are drawn for maximum and minimum levels of solar activity. Arcing causes current surges that produce out of tolerance bus regulation conditions. Material damage can result from carbon tracking and shorting between insulation punctures. Such problems are known to have happened on some spacecraft, and are suspected as the source of anomalies on other vehicles.

In addition, plasma particle current collection causes parasitic losses such as those described in FIG. 3. In this connection, reference is made to the publication of John R. Barton et al., "High Voltage Solar Array Plasma Protection Techniques," Proceedings of the 18th IEEE Photovoltaic Specialist Conference, October, 1985, pp 411–417. Exposed conductors such as solar cell interconnectors act like electrodes in a plasma environment, necessitating their isolation from the plasma.

The plasma interaction problem, which occurs primarily at low and medium altitudes, could be eliminated by keeping the solar array voltage below the voltage at which the leakage is initiated. To avoid plasma interaction when operating a high power electrical system, the solar array voltage must be limited to a safe level and the system voltage is raised by power conditioning to the required level prior to transmission to the electrical loads. The power conditioning can be designed for operation in a plasma environment by insulating exposed terminals and conductors and proper enclosure packaging. Power conditioning, however, introduces power losses of several percent. It is desirable, therefore, to generate high voltage levels directly at the solar array to minimize power conditioning. Such high voltage designs cannot be employed unless plasma interaction is eliminated by protecting the solar array from the plasma.

SUMMARY OF THE INVENTION

The object of the present invention is to provide a solar array that is resistant to voltage/plasma interaction effects in a space environment.

A further object of the present invention is to provide a solar array that can operate at high temperatures and withstand the temperature cycling encountered in the space environment.

These and other objects are achieved by a solar array that encapsulates photovoltaic cells in glass to achieve plasma isolation. More specifically, in accordance with one aspect of the invention, there is provided a solar array comprising:

a. solar cells for converting solar energy to electrical energy;

b. a substrate having support ridges extending from the inner surface thereof to contact and position said solar cells; and c. a superstrate having support ridges extending from the inner surface to contact and position said solar cells without bonding said solar cell means to said support ridges of said substrate or said superstrate.

Glass encapsulation of the solar cells reduces cell damage by slowing medium and high speed particles, and by stopping low speed particles. The solar cells are sandwiched between the integral support ridges of the substrate and superstrate without bonding to avoid thermomechanical stresses due to mismatch between the respective coefficients of thermal expansion. Further, the integral support ridges are staggered to reduce pressure on the glass/cell interface to prevent bonding while maintaining adequate pressure to protect the cell from launch vibration. The integral support ridges also serve to transfer heat from the solar cells to the highly emissive glass substrate and superstrate to improve radiation cooling from both sides of the array.

The structure of the instant invention overcomes problems associated with prior attempts to perform glass encapsulation by depositing an integral glass coating directly on solar cells (See, for example, U.S. Pat. No. 4,234,351). Problems have been experienced with glass coatings exhibiting cracking failures due to thermomechanical stresses.

In a preferred embodiment of the invention, additional protection is provided by conductive grid networks which are incorporated on the outer surface of the glass enclosure to serve as zero potential ground planes to reduce the electrical fields surrounding the solar array. The conductive grid networks reduce the buildup of electrical fields that could cause damage to the solar cells should holes or cracks develop in the glass enclosure, for example, by a micrometeor striking and penetrating the glass enclosure. These and other advantages of the invention will become apparent with reference to the description of the preferred embodiment contained herein.

BRIEF DESCRIPTION OF THE DRAWINGS

With the above as background, reference should now be made to the following figures (not drawn to scale) for a detailed description of the invention.

DESCRIPTION OF THE PREFERRED EMBODIMENT

Figure 1:
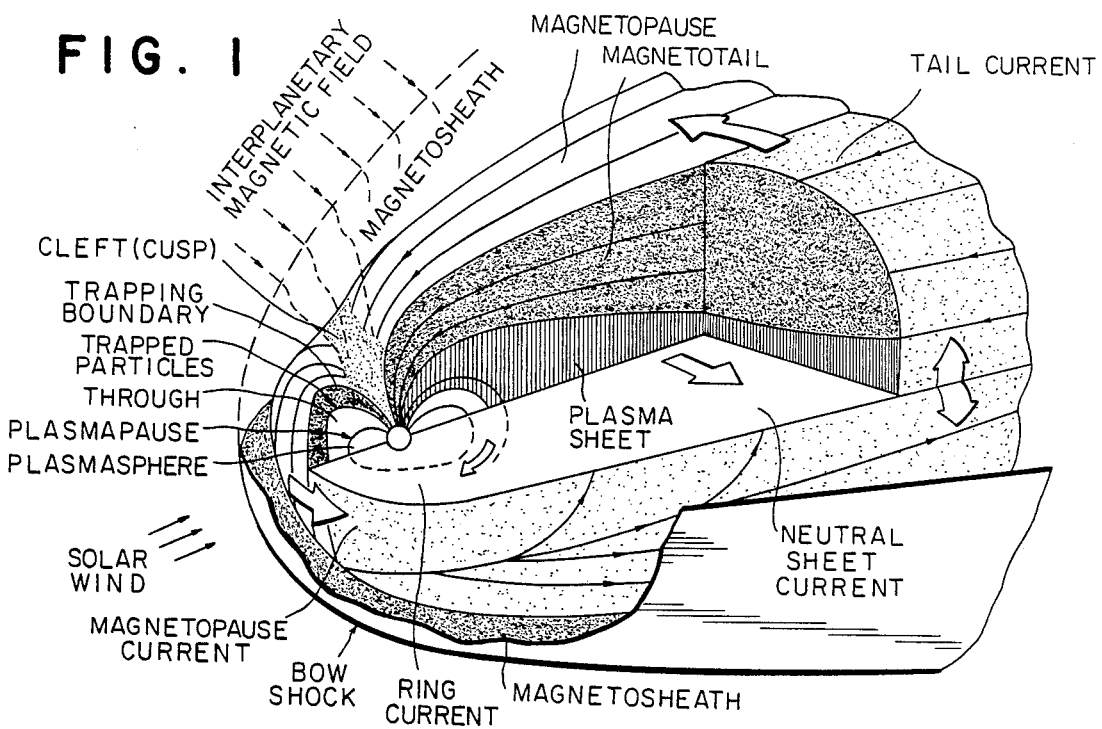
FIG. 1 is a drawing illustrating the Earth's magnetosphere.
Figure 2:
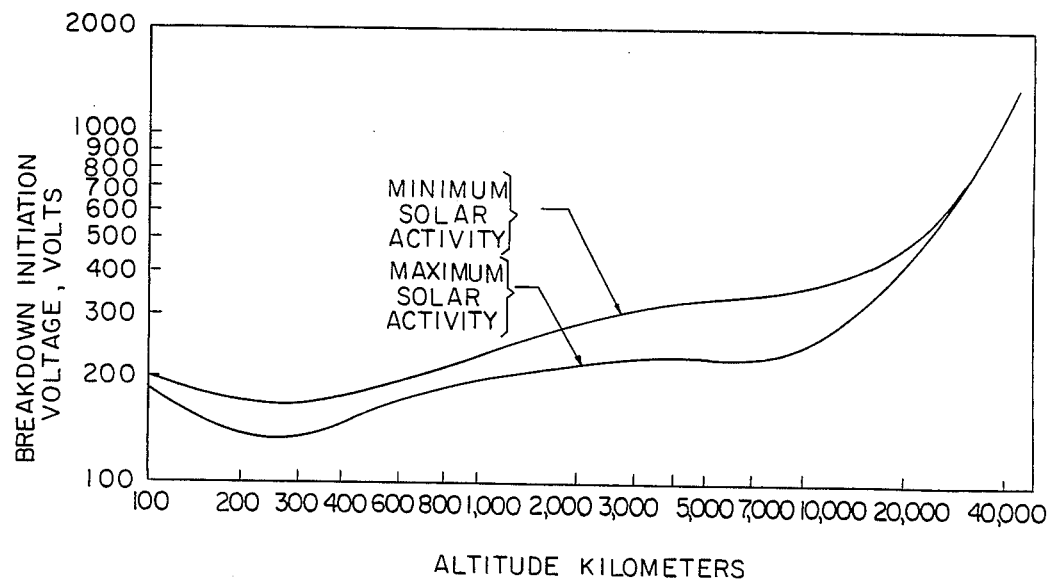
FIG. 2 is a graph showing the effects of plasma on a solar array with exposed bare conductors.
Figure 3:
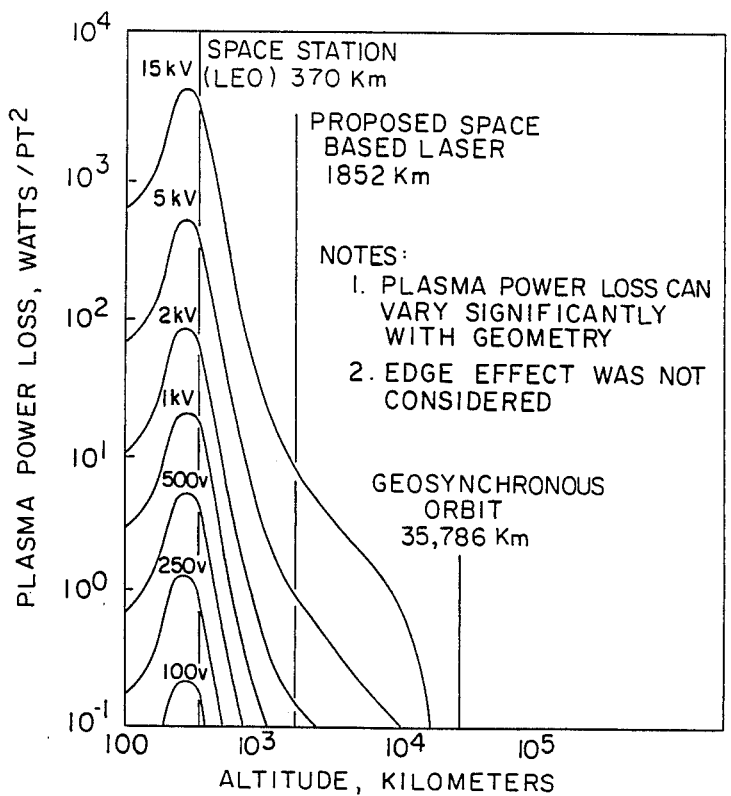
FIG. 3 is a graph showing the potential solar array plasma power loss versus altitude.
Figure 4:
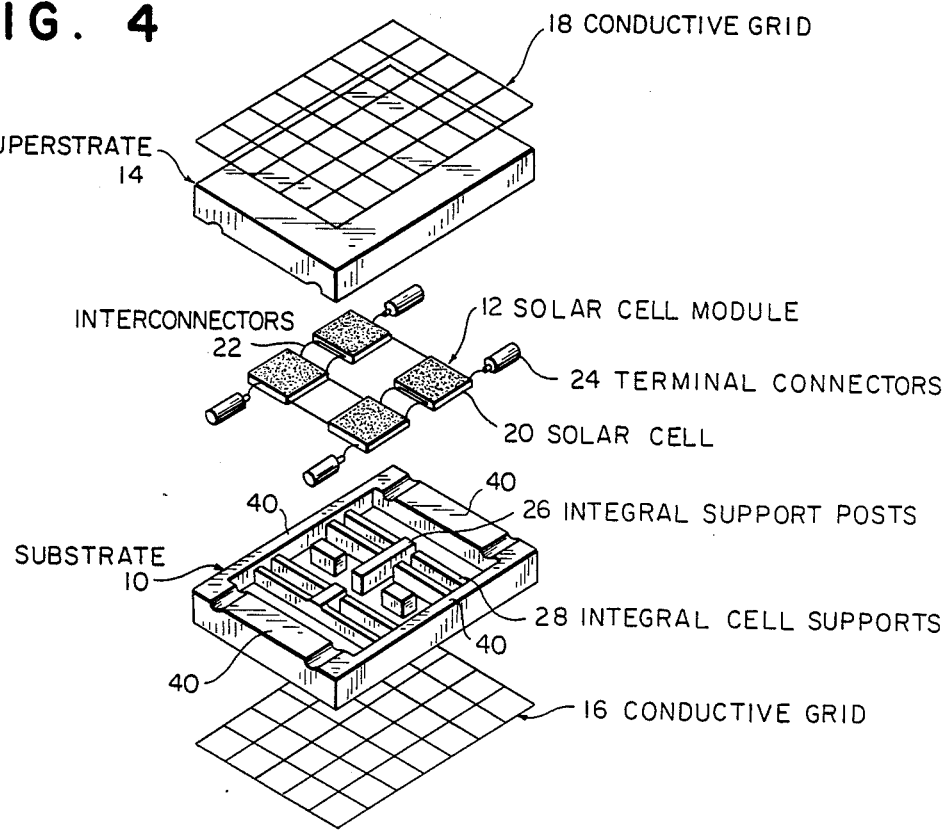
FIG. 4 is an exploded view of a solar array according to one embodiment of the present invention.

Referring to FIG. 4 of the drawings, a solar array according to the present invention is shown having a substrate 10, a solar cell module 12, a superstrate 14, a conductive grid 16 bonded to the substrate and a conductive grid 18 bonded to the superstrate.

Figure 6:
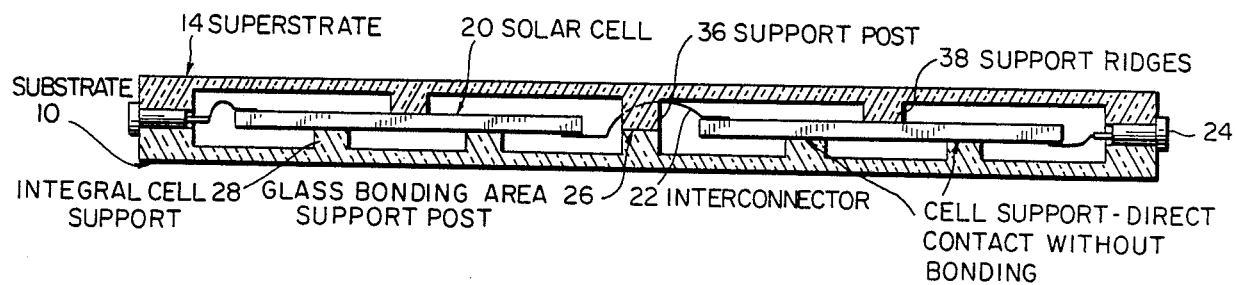
FIG. 6 is a cross-section of the solar array shown in FIG. 4.
Figure 7:
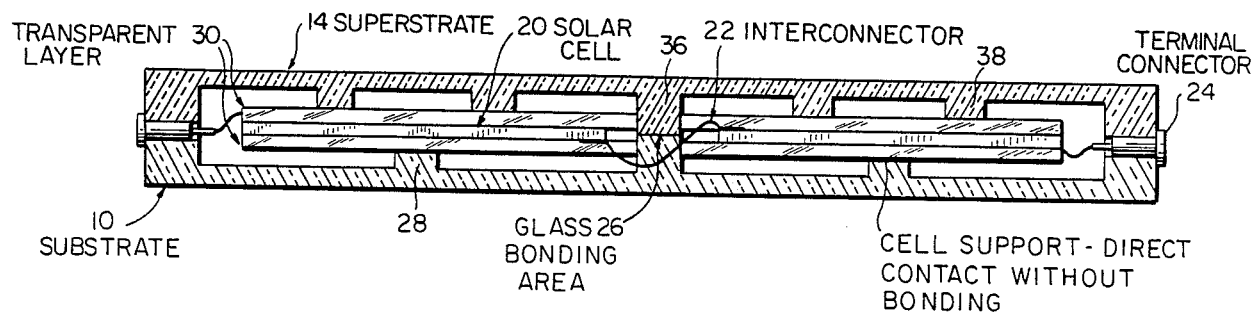
FIG. 7 is a cross-section of a solar array according to a second embodiment of the present invention.

As shown in FIG. 4, the solar cell module 12 includes four solar cells 20 that are electrically connected with stress relief interconnectors 22, such as silver mesh, that are welded to the cells 20. The interconnectors 22 are in turn welded to terminal connectors 24 that provide electrical connection of the solar cells 20 to external elements. The interconnectors 22 are shaped to avoid interfering with integral support posts (or longitudinal ribs) 26 and integral cell supports (or transverse ribs) 28 located on the inner surface of the substrate 10. Integral support post 36 and integral support ridges 38 are provided on the superstrate 14 as shown in FIGS. 6 and 7.

Figure 5:
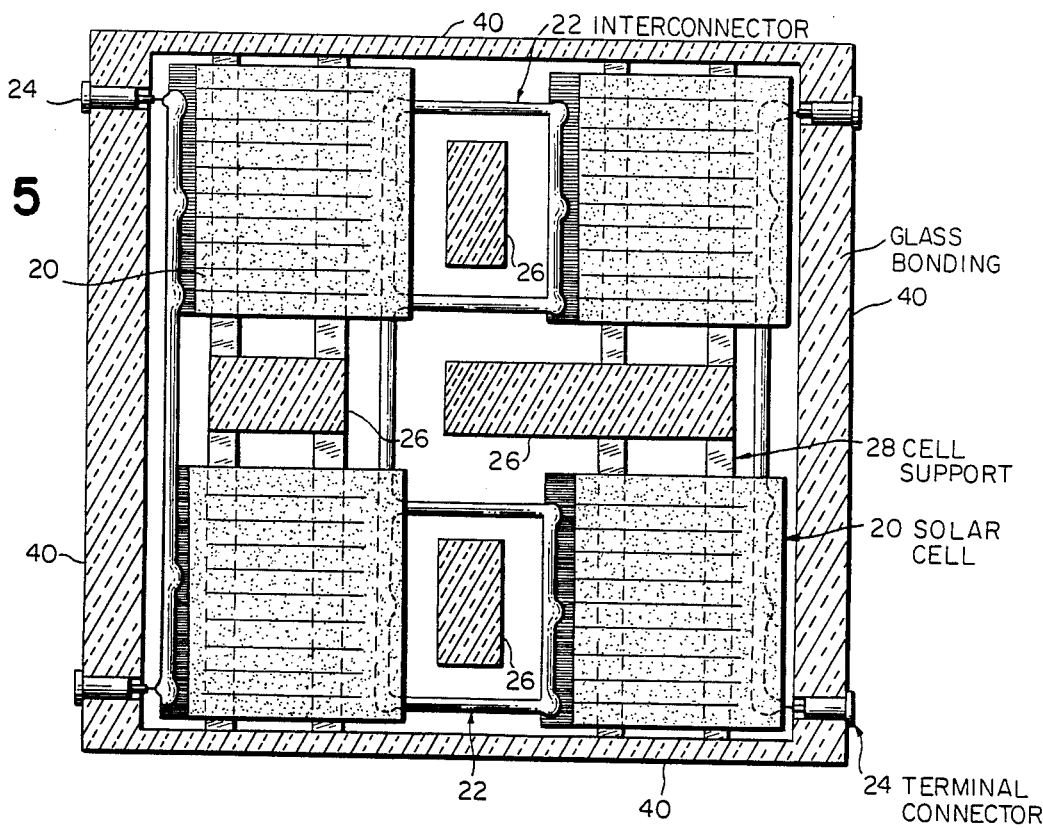
FIG. 5 is a top view of a solar cell module seated in the substrate of the solar array shown in FIG. 4.

The solar cells 20 rest on the integral cell supports 28 of the substrate 10 as shown in FIG. 5. No adhesive or bonding is provided between the cell supports 28 and the solar cells 20. The support posts 26 extend above the cell supports 28, are located between the solar cells 20, and, together with support post 36, provide structural support between the substrate 10 and the superstrate 14. Support posts 26 and 36 also provide additional, intermediate glass bonding ridges for connecting the substrate and superstrate. The support ridges 38 of the superstrate 14 are staggered with respect to the cell supports 28 of the substrate 10 as shown in FIG. 6. The staggered cell supports 28 and support ridges 38 reduce cell/glass compression, and protect the solar cells 20 by damping launch vibration effects. The staggered cell supports 28 and support ridges 38 also contact the solar cells and provide a heat conduction path to transfer heat from the solar cells 20 to the substrate 10 and superstrate 14 where the heat is radiated away.

The primary connection between the substrate 10 and superstrate 14 is achieved through bonding of corresponding bonding ridges or end walls 40 of each, as shown in FIGS. 4 and 5. The end walls and aligned support posts 26 and 36 define receiving wells for seating solar cells loosely on the cell supports 28.

The solar cells 20 are free to expand and contract independent of the substrate 10 and superstrate 14 as no bonding occurs between the cell supports 28, support ridges 38 and the solar cells 20. Since thermal expansion of the solar cells 20 occurs without causing stress in the cells or the glass substrate 10 and superstrate 14, the ability of the solar array to survive thermal cycling is greatly improved over devices employing integral coverglasses on the solar cells.

Borosilicate glass, which has a coefficient of thermal expansion closest to that of a silicon solar cell, is employed for the substrate 10 and superstrate 14 when silicon solar cells are used in the array. Corning 7070 and Corning 7740 (Pyrex) glass are examples of borosilicate glasses that may be employed in the present invention. Corning 7740 is preferred, however, as Pyrex has greater residual stresses than Corning 7070. Pilkington's CMX and CMZ are cerium-stabilized, phosphorous-doped, borosilicate glasses that are also suitable for use as substrate 10 and superstrate 14.

The substrate 10 and superstrate 14 may be bonded to one another by adhesives, fusion bonding, or electrostatic bonding depending on mission requirements and assembly cost. If the mission environment does not entail high temperatures, adhesive bonding of the substrate 10 and superstrate 14 may be employed. In such situations, adhesive bonding is sufficient to provide proper encapsulation to protect the solar array from environmental effects. In situations where high temperatures are expected, fusion bonding or electrostatic bonding is employed.

During fusion bonding, the glass substrate 10 and superstrate 14 are mated under high pressure at high temperatures (600 degrees C. to 700 degrees C.) for approximately twenty minutes. For electrostatic bonding of the substrate 10 to the superstrate 14, an interfacial layer may be used such as silicon, aluminum, or $SiO_x$. The temperature is raised to at least 400 degrees C. until the glass becomes ionically conductive, and electric field is applied to produce ion mobilization and bonding. Of course, when high temperature bonding is employed, high temperature solar cells must be employed that can withstand the bonding processes.

The solar array is capable of tolerating low temperatures for either of the aforementioned bonding processes because there are no bonds between the solar cells 20 and the substrate 10 or superstrate 14, so the solar cells 20 and the surrounding glass substrate 10 and superstrate 14 can expand and contract at different rates. The substrate 10 and superstrate 14 have the same thermal expansion coefficients and the glass-to-glass bonding areas between the two are at or near the same temperature. Thus, the glass-to-glass bonds will easily withstand low temperatures. In high temperature environments, however, fusion or electrostatic bonding should be employed.

In addition to the encapsulation of the solar array in glass to prevent interaction with the plasma, the preferred embodiment of the present invention provides conductive grids 16, 18 on the outside surface of the substrate 10 and superstrate 14 respectively. The conductive grids 16, 18 are employed to provide a zero-potential ground plane to effectively reduce the solar array electric field. The electric field acts as an arcing path between the solar cells 20 and the plasma. The conductive grids 16, 18 prevent arcing should holes or cracks develop in the substrate 10 or superstrate 14, for example, by the penetration of a micrometeor. A material for the conductive grids 16, 18 that forms no oxides or nonvolatile oxides should be chosen for the grid to be nonreactive in a residual atomic oxygen environment. An example of a suitable material is $In_2O_3$.

The invention has been described in detail with particular reference to preferred embodiments thereof, but it will be understood that variations and modifications can be effected within the spirit and scope of the invention. For example, as shown in FIG. 7, additional transparent layers 30 may be added to one or both sides of the solar cells 20 to provide additional radiation protection. In some cases, it may be desirable to employ a material such as quartz for these layers 30, and a different material for the superstrate 14 and substrate 10 to optimize the radiation protection characteristics and weight characteristics of the solar array. Further, while in many cases hermetic sealing of the solar array may be unnecessary, the solar array may be evacuated or filled with an inert gas to prevent breakdown of trapped air at low to medium voltages. In such a case, the support posts 26 and 36 provide the additional feature of preventing distortion due to pressure differentials during transition from atmospheric to space environments.

What is claimed is:

1. A solar cell device comprising:
   (a) solar cell means for converting solar energy to electrical energy;
   (b) a substrate having cell supports extending from the inner surface thereof to contact and position said solar cell means without bonding; and
   (c) a superstrate having cell support ridges extending from the inner surface to contact and position said solar cell means without bonding said solar cell means to said cell supports of said substrate or said support ridges of said superstrate.

2. A solar cell device as claimed in claim 1 wherein said substrate and said superstrate comprise glass.

3. A solar cell device as claimed in claim 2 wherein said glass is a borosilicate glass.

4. A solar cell device as claimed in claim 1 wherein said substrate and said superstrate are adhesively bonded.

5. A solar cell device as claimed in claim 2 wherein said substrate and said superstrate are electrostatically bonded.

6. A solar cell device as claimed in claim 1 further comprising a conductive grid network formed on the outer surfaces of said solar cell device.

7. A solar cell device as claimed in claim 2 wherein said substrate and said superstrate are fusion bonded.

8. A solar cell device as claimed in claim 1 wherein said substrate and said superstrate are non-adhesively bonded.

9. A solar cell device as claimed in claim 1 wherein said cell supports of said substrate are staggered with respect to said support ridges of said superstrate.

10. A solar cell device as claimed in claim 1 further comprising:
    (a) a peripheral substrate bonding ridge; and
    (b) a peripheral superstrate bonding ridge in bonding contact with the substrate bonding ridge to join the substrate and superstrate.

11. A solar cell device as claimed in claim 10 wherein said substrate bonding ridge and said superstrate bonding ridge are in bonding contact with one another along substantially the entire periphery of said solar cell device.

12. A solar cell device as claimed in claim 10 further comprising an intermediate bonding ridge disposed within said periphery of said substrate, and an intermediate superstrate support ridge disposed within said periphery of said superstrate for bonding the substrate and superstrate together.

13. A solar device as claimed in claim 1 further comprising a conductive grid network disposed on an outer surface of the device substrate and superstrate.

14. A solar cell array comprising:
    (a) a plurality of solar cells;
    (b) a substrate having integral cell supports formed on an inner surface of said substrate for supporting said solar cells above the surface;
    (c) a superstrate having integral support ridges for holding said solar cells in non-bonded contact with said integral cell supports of said substrate when said superstrate is bonded to said substrate to form an enclosed cell area that encloses said solar cells;
    (d) means for providing electrical connection of said solar cells from said enclosed cell area to an external element; and
    (e) a conductive grid network formed on the outer surfaces of said substrate and said superstrate for providing a zero-potential ground plane.

15. A solar cell array as claimed in claim 14 wherein said substrate and said superstrate are adhesively bonded.

16. A solar cell array as claimed in claim 14 wherein said substrate and said superstrate are non-adhesively bonded.

17. A solar cell array as claimed in claim 14 wherein said enclosed cell area is hermetically sealed.

18. A solar cell array as claimed in claim 14 wherein said integral cell supports of said substrate are staggered with respect to said integral support ridges of said superstrate.

19. A solar cell array as claimed in claim 14 wherein said substrate and said superstrate include corresponding bonding surfaces for interconnecting the substrate and superstrate and for enclosing the solar cells.

20. A solar cell array comprising:
(a) a substrate having cell supports formed on the inner surface of said substrate;
(b) a first protective layer placed in non-bonding contact with said cell supports of said substrate;
(c) a plurality of solar cells placed in contact with said first protective layer;
(d) a second protective layer placed over said solar cells;
(e) a superstrate having cell contacts formed on a first surface of said glass superstrate and in non-bonding contact with said second protective layer to hold said solar cells in place;
(f) means for providing external electrical contact to said solar cells; and
(g) conductive grid means formed on an outer surface of at least one of said substrate and superstrate for providing a zero potential ground plane.

21. A solar cell array as claimed in claim 20 wherein said first and second protective layers are comprised of quartz.

22. A solar array comprising:
(a) a plurality of solar cells;
(b) a substrate having cell supports formed on an inner surface of said substrate for supporting said solar cells above the surface;
(c) a superstrate having cell support ridges for holding said solar cells in non-bonded contact with said cell supports of said substrate when said superstrate is bonded to said substrate to form an enclosed cell area that encloses said solar cells;
(d) means for providing electrical connection of said solar cells from said enclosed cell area to an external element; and
(e) conductive grid network formed on at least one of an outer surface of said substrate and an outer surface of said superstrate for providing a zero-potential ground plane.

* * * * *